(12) United States Patent
Mäki et al.

(10) Patent No.: US 10,999,683 B2
(45) Date of Patent: May 4, 2021

(54) MICROPHONE ASSEMBLY AND ELECTRONIC DEVICE COMPRISING A MICROPHONE ASSEMBLY

(71) Applicant: HUAWEI TECHNOLOGIES CO., LTD., Shenzhen (CN)

(72) Inventors: Jouni Tapio Mäki, Helsinki (FI); Juuso Heiskanen, Helsinki (FI)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/495,293

(22) PCT Filed: Mar. 21, 2017

(86) PCT No.: PCT/EP2017/056706
§ 371 (c)(1),
(2) Date: Sep. 18, 2019

(87) PCT Pub. No.: WO2018/171870
PCT Pub. Date: Sep. 27, 2018

(65) Prior Publication Data
US 2020/0037081 A1    Jan. 30, 2020

(51) Int. Cl.
*H04R 19/04*         (2006.01)
*B81B 7/00*          (2006.01)
(Continued)

(52) U.S. Cl.
CPC ............ *H04R 19/04* (2013.01); *B81B 7/007* (2013.01); *B81B 7/0061* (2013.01); *H04R 1/04* (2013.01);
(Continued)

(58) Field of Classification Search
CPC ....... B81B 7/0061; B81B 7/007; B81B 7/008; H04R 1/04; H04R 1/222; H04R 1/00;
(Continued)

(56) References Cited

U.S. PATENT DOCUMENTS 8,804,993 B2    8/2014  Shukla et al.
2001/0024129 A1*  9/2001  Akram ................. G01R 1/0408
                                                324/750.25
(Continued)

FOREIGN PATENT DOCUMENTS

CN      1671247 A    9/2005
CN    102395259 A    3/2012
(Continued)

*Primary Examiner* — Fan S Tsang
*Assistant Examiner* — Julie X Dang
(74) *Attorney, Agent, or Firm* — Rimon PC

(57) ABSTRACT

A microphone assembly comprising a microphone unit secured to a mounting element. The microphone unit has a first side comprising an audio port, and the mounting element comprises a rigid body having a mounting side. The first side of the microphone unit is arranged at a right angle to the mounting side of the mounting element. The microphone unit may comprise a micro electromechanical systems (MEMS) microphone package holding a MEMS microphone die, and the mounting side of the mounting element may be configured for being mounted or soldered to a printed circuit board. The microphone assembly may be mounted to a device printed circuit board.

20 Claims, 6 Drawing Sheets

(51) Int. Cl.
  *H04R 1/04* (2006.01)
  *H04R 3/00* (2006.01)
  *H04R 19/00* (2006.01)
(52) U.S. Cl.
  CPC .............. *H04R 3/00* (2013.01); *H04R 19/005* (2013.01); *B81B 2201/0257* (2013.01); *H04R 2201/003* (2013.01)
(58) Field of Classification Search
  CPC .......... H04R 1/08; H04R 1/083; H04R 19/04; H04R 19/005; H04R 19/00
  USPC ........ 381/369, 355, 361, 334, 189, 173, 322
  See application file for complete search history.

(56) References Cited

U.S. PATENT DOCUMENTS

| | | | |
|---|---|---|---|
| 2003/0165303 A1* | 9/2003 | Pendse | G02B 6/4277 385/89 |
| 2005/0207604 A1* | 9/2005 | Akino | H04R 1/08 381/361 |
| 2010/0128914 A1* | 5/2010 | Khenkin | H04R 31/006 381/361 |
| 2010/0272302 A1 | 10/2010 | Feiertag et al. | |
| 2013/0032905 A1* | 2/2013 | Lo | H01L 21/50 257/416 |
| 2013/0142374 A1* | 6/2013 | Lee | H04R 1/04 381/361 |
| 2014/0001580 A1* | 1/2014 | Bolognia | H04R 19/005 257/416 |
| 2014/0254850 A1* | 9/2014 | Elian | H04R 17/025 381/355 |
| 2017/0374441 A1* | 12/2017 | Hoekstra | H04R 1/2853 |

FOREIGN PATENT DOCUMENTS

| | | |
|---|---|---|
| CN | 103125019 A | 5/2013 |
| CN | 104185099 A | 12/2014 |
| CN | 204810726 U | 11/2015 |
| CN | 106162394 A | 11/2016 |
| WO | 2010062820 A2 | 6/2010 |

* cited by examiner

MICROPHONE ASSEMBLY AND ELECTRONIC DEVICE COMPRISING A MICROPHONE ASSEMBLY

CROSS-REFERENCE TO RELATED APPLICATIONS

This application is a national stage of International Application No. PCT/EP2017/056706, filed on Mar. 21, 2017, which is hereby incorporated by reference in its entirety.

TECHNICAL FIELD

The disclosure relates to a compact microphone assembly, and more particularly to a compact microphone assembly comprising a mounting element and a microphone unit with an audio port.

BACKGROUND

A typical microelectromechanical systems (MEMS) microphone package includes a substrate, such as a base printed circuit board (PCB), a MEMS microphone die attached to the substrate and a cup-shaped lid or cover that is attached to the substrate to create a chamber, within which the microphone die is protected from environmental influences. An aperture or audio port is defined in the lid, through which aperture sound enters the chamber. The microphone die detects the sound and generates corresponding electrical signals. The package typically includes electrical contact pads on the bottom surface of the substrate, by which the package can be mechanically and electrically connected to a circuit board, such as by solder or electrically conductive adhesive.

MEMS microphones are commonly used in mobile telephones and other electronic devices. These devices are typically made by placing printed circuit boards inside plastic housings. The housings usually define ports (holes) adjacent the MEMS microphone packages, so the users' speech may enter the housing and be detected by the microphones.

Ergonomic considerations typically lead to microphone ports being located on thin sides, rather than on broad flat surfaces, of the electronic devices. For example, on a mobile telephone, the microphone port is typically located on the thin lower side of the telephone. The main circuit board of the mobile telephone is co-planar with the front of the telephone, and the MEMS microphone package may be soldered to the main circuit board with the lid holding the audio port being co-planar or parallel to the main circuit board and the front of the telephone. A V- or L-shaped audio channel may be formed in order to conduct a user's speech from the microphone port of the lower side of the telephone to the audio port of the MEMS microphone package. However, the use of a V- or L-shaped audio channel will reduce the audio performance due to loss of the audio signal in the curved or angled audio channel.

Another solution is to use a flexible printed circuit board, flex PCB, to provide electronic connections between the main circuit board and the MEMS microphone package. With the flex PCB, it is possible to use a straight audio channel, and to arrange the MEMS microphone package with the lid and the audio port facing the straight audio channel, thereby improving the audio performance. However, the assembly of the flex PCB to the MEMS microphone package and the main printed circuit board is expensive as it requires manual assembly.

Thus, there is a need for a compact microphone assembly, which is well suited for automatic placing and soldering processes, while providing a high audio performance when being arranged within a compact electronic device, such as e.g. a mobile telephone.

SUMMARY OF THE INVENTION

It is an object of the invention to provide a microphone assembly, which can be arranged within a compact electronic device using a standard automatic placing and soldering process and in a position, which provides a high audio performance. It is also an object of the present invention to provide an electronic device comprising such a microphone assembly.

According to a first aspect, there is provide a microphone assembly comprising a microphone unit secured to a mounting element, said microphone unit being provided with a first side comprising an audio port, said mounting element comprising a rigid body having a mounting side and said first side being arranged at a right angle to said mounting side.

The microphone unit may for example be a rigid unit, which can be rigidly secured to the rigid body of the mounting element. A rigid body in the context of this disclosure is a body substantially unable to bend or be forced out of shape. The rigid body is sufficiently inflexible to secure the position of the microphone unit. The rigid body does not have flexural or elastic properties that allow the position of the microphone unit to be substantially changed without use of excessive force. Thus, the microphone assembly may form a single rigid package, which package can be mechanically and electrically connected to a circuit board. By having the first side of the microphone unit positioned at a right angle to the mounting side of the mounting element, the first side with the audio port can be positioned in a vertical position relative to a circuit board, to which the microphone assembly is positioned. Such a vertical position allows an arrangement of the audio port for an optimal audio performance when receiving the speech of a user.

In a first possible implementation form of the microphone assembly according to the first aspect, the microphone unit is secured to a planar or at least substantially planar second contact side of said rigid body. A planar surface in the context of this disclosure is a surface that is smooth and even, preferably a flat smooth and even surface.

In a second possible implementation form of the microphone assembly according to the first aspect as such or according to the first implementation form of the first aspect, the mounting side is configured for being mounted or soldered to a printed circuit board. By having the mounting side being mountable or solderable to a printed circuit board, the microphone assembly may be well suited for mounting by an automatic placing and soldering process.

In a third possible implementation form of the microphone assembly according to the first aspect as such or according to any of the preceding implementation forms of the first aspect, the microphone unit comprises a microphone component, i.e. a transducer that converts sound into an electrical signal. The microphone component may be in the form of a microelectromechanical systems (MEMS) microphone package holding a MEMS microphone die.

In a fourth possible implementation form of the microphone assembly according to the first aspect as such or according to any of the preceding implementation forms of the first aspect, the microphone unit comprises a housing, and the first side is part of said housing.

In a fifth possible implementation form of the microphone assembly according to the fourth implementation form of the first aspect, the microphone unit comprises a base printed circuit board, and the housing is secured to said base printed circuit board with the audio port facing away from said base printed circuit board.

When the microphone unit comprises a MEMS microphone package holding a MEMS microphone die, the MEMS microphone die may be attached to the base printed circuit board, base PCB, within a chamber formed by the housing and the base PCB. The MEMS microphone die may be positioned for alignment with the audio port in the first side of the housing for receiving sound entering through the audio port.

In a sixth possible implementation form of the microphone assembly according to the fifth implementation form of the first aspect, the base printed circuit board has a substantially planar first contact side facing away from said first side, and the first contact side is provided with a number of first electrical contacts or contact pads for providing electrical contact between the microphone unit and the mounting element.

In a seventh possible implementation form of the microphone assembly according to the sixth implementation form of the first aspect, the mounting element has a substantially planar second contact side facing the first contact side, and the second contact side is provided with a number of second electrical contacts or contact pads.

In an eighth possible implementation form of the microphone assembly according to the seventh implementation form of the first aspect, at least a part of the second electrical contacts or contact pads face one or more of the first electrical contacts or contact pads and are electrically connected to said one or more first electrical contacts or contact pads.

In a ninth possible implementation form of the microphone assembly according to the seventh or the eighth implementation form of the first aspect, the first and second contact sides are at a right angle to the mounting side.

The first and second electrical contacts or contact pads allows the microphone unit to be electrically secured to the mounting element by use of solder paste, such as a high temperature solder paste, or by use of an anisotropic conductive adhesive, ACA, such as an anisotropic conductive film, ACF, or an anisotropic conductive paste, ACP.

Thus, in a tenth possible implementation form of the microphone assembly according to the eighth or the ninth implementation form of the first aspect, the electrical connection between the first and second electrical contacts or contact pads is provided by use of an anisotropic conductive adhesive, ACA, such as an anisotropic conductive film, ACF, or an anisotropic conductive paste, ACP. The ACA may comprise an epoxy type resin with conductive particles. When using an anisotropic conductive adhesive for securing the microphone unit to the mounting element, the resulting microphone assembly can resist reflow temperatures, whereby the microphone assembly can be used as a component in an engine or automatic PCB reflow process.

In an eleventh possible implementation form of the microphone assembly according to the first aspect as such or according to any of the preceding implementation forms of the first aspect, the mounting element comprises electrical conduits or signal lines for connecting the microphone unit to electrical contacts or contact pads in the mounting side of the mounting element.

In a twelfth possible implementation form of the microphone assembly according to the eleventh and any of the seventh, eighth, ninth or tenth implementation forms of the first aspect, the electrical conduits or signal lines connect the second electrical contacts or contact pads with one or more of the electrical contacts or contact pads in the mounting side.

In a thirteenth possible implementation form of the microphone assembly according to the first aspect as such or according to any of the preceding implementation forms of the first aspect, the mounting element comprises a printed circuit board, a miniature printed circuit board, an insert molded plastic, such as a molded interconnect part manufactured by use of laser direct structuring (LDS), and/or a sheet metal part.

In a fourteenth possible implementation form of the microphone assembly according to the first aspect as such or according to any of the preceding implementation forms of the first aspect, the mounting element comprises an abutment side parallel with said first side and facing away from said first side. The abutment side may be configured for abutment with an edge of a printed circuit board to which the mounting element is mounted or soldered. Thus, the abutment side may help in aligning the microphone assembly when mounting the microphone assembly to a printed circuit board, which may be part of an electronic device.

In a fifteenth possible implementation form of the microphone assembly according to the first aspect as such or according to any of the preceding implementation forms of the first aspect, the assembly forms an L- or T-shaped part.

When using a mounting element having an L-shaped or T-shaped form, the microphone unit can be received by the mounting element at different positions relative to the mounting side, whereby the audio port of the microphone unit can be positioned at different heights relative to the mounting side, and thereby also at different heights relative to a printed circuit board, when the microphone assembly is mounted to a printed circuit board.

In a sixteenth possible implementation form of the microphone assembly according to the first aspect as such or according to any of the preceding implementation forms of the first aspect, the first side comprising the audio part is substantially flat or planar.

In a seventeenth possible implementation form of the microphone assembly according to the first aspect as such or according to any of the preceding implementation forms of the first aspect, the mounting side is flat or planar.

According to a second aspect, there is provided an electronic device comprising a device printed circuit board and a microphone assembly according to the first aspect as such or according to any of the implementation forms of the first aspect, wherein the microphone assembly is mounted to said device printed circuit board.

In a first possible implementation form of the electronic device according to the second aspect, the electronic device further comprises a cover part provided with an audio channel extending along a straight line through said cover part towards said audio port.

In a second possible implementation form of the electronic device according to the first implementation form of the second aspect, the audio port is aligned with said straight audio channel.

When using a straight audio channel, which can be relatively short, sound waves may progress through the audio channel with only a small disturbance before reaching the audio port of the microphone unit, thereby improving the audio performance of the electronic device. A straight audio channel also provides an easier path for moisture, which might have entered through the channel, to vaporize out again, thereby improving the reliability of the electronic device.

In a third possible implementation form of the electronic device according to the first or second implementation form of the second aspect, the device printed circuit board is secured to the cover part in a position with the first side of the microphone unit facing an inner end of the audio channel and at a right angle to a center line of said audio channel.

In a fourth possible implementation form of the electronic device according to the first, second or third implementation form of the second aspect, the microphone assembly is secured to the device printed circuit board with the mounting side of the mounting element facing an upper surface of the device printed circuit board, and the device printed circuit board is secured to the cover part with said upper surface extending parallel to the center line of the audio channel. Such an arrangement of the microphone assembly and the device printed circuit board supports the alignment of the audio port with the audio channel.

In a fifth possible implementation form of the electronic device according to the fourth implementation form of the second aspect, the device printed circuit board has a front edge facing the inner surface of the said cover part, and the device printed circuit board is secured to the cover part with a distance provided between the front edge and said inner surface, whereby the first side of the microphone unit is positioned at a distance to the inner surface. By arranging the first side of the microphone unit at a distance to the cover part, the distance between the audio port and the audio channel can be set for optimizing the audio performance, and/or a dustproof/waterproof gasket can be placed in the gap between the first side of the microphone unit and the inner surface of the said cover part.

In a sixth possible implementation form of the electronic device according to the first, second, third, fourth or fifth implementation forms of the second aspect, the device printed circuit board has a front edge facing an inner surface of the cover part, and the mounting element comprises an abutment part with an abutment side parallel with and facing away from the first side of the microphone unit, wherein the mounting element is secured to the device printed circuit board with the abutment side facing said front edge. The abutment part with the abutment side helps in aligning the microphone assembly when mounting the microphone assembly to the device printed circuit board.

The foregoing and other objects are achieved by the features of the independent claims. Further implementation forms are apparent from the dependent claims, the description and figures.

BRIEF DESCRIPTION OF THE DRAWINGS

In the following detailed portion of the present disclosure, the aspects, embodiments, and implementations will be explained in more details with reference to the embodiments shown in the drawings, in which.

DETAILED DESCRIPTION

It is within embodiments of the disclosure to propose a solution to solve the problem of providing a microphone assembly, which can easily be arranged within a compact electronic device, such as a slim mobile phone, while providing a high audio performance in receiving for example a user's speech or audio for video recording.

Figure 1:
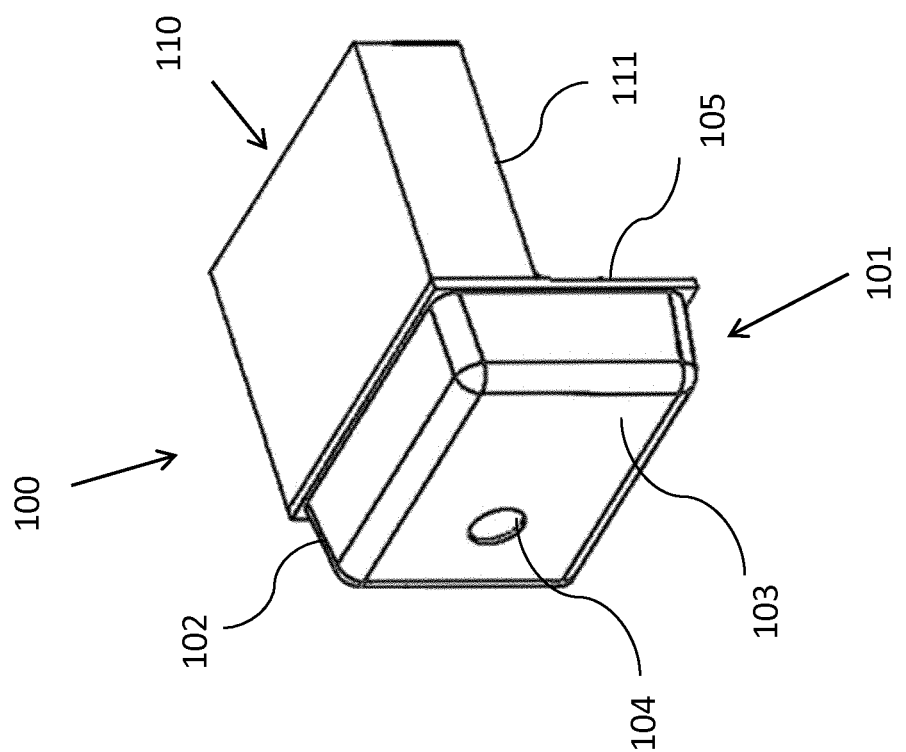
FIG. 1 shows a microphone assembly according to an embodiment.

FIG. 1 shows a microphone assembly 100 according to an embodiment. The assembly 100 comprises a microphone unit 101 secured to a mounting element 110, where the microphone unit 101 has a housing or lid 102 with an outwards facing first side 103, which may be substantially flat or planar, and where an aperture or an audio port 104 is provided in said first side 103 of the housing 102. The microphone unit 101 has a microphone within the housing 102, which microphone may receive an audio signal through the audio port 104. The housing 102 of the microphone unit 101 is secured to a base printed circuit board 105, base PCB, (which can be understood to be part of the microphone unit 101) with the audio port 104 facing away from the base PCB 105. The mounting element 110 has a mounting side 111, which may be the bottom of the mounting element 110 and which may be substantially flat or planar, and which may be configured for being mounted or soldered to a device printed circuit board, device PCB, (different from the base PCB 105) of for example a mobile device. The mounting element 110 has an outer surface area 112 (shown in FIG. 2), which may form an upper side, and which is opposite the mounting side 111. The microphone unit 101 is secured to the mounting element 110 with the first side 103 of the housing 102 being arranged at a right angle to the mounting side 111. It is preferred that the microphone unit 101 is rigidly secured to the mounting element 110. Hence, there is not a flexible connection like a flexible PCB foreseen or needed between the microphone unit 101 and the mounting element 110. The microphone unit 101 is secured to the mounting element 110 with part of the base PCB 105 abutting the mounting element 110.

Figure 2:
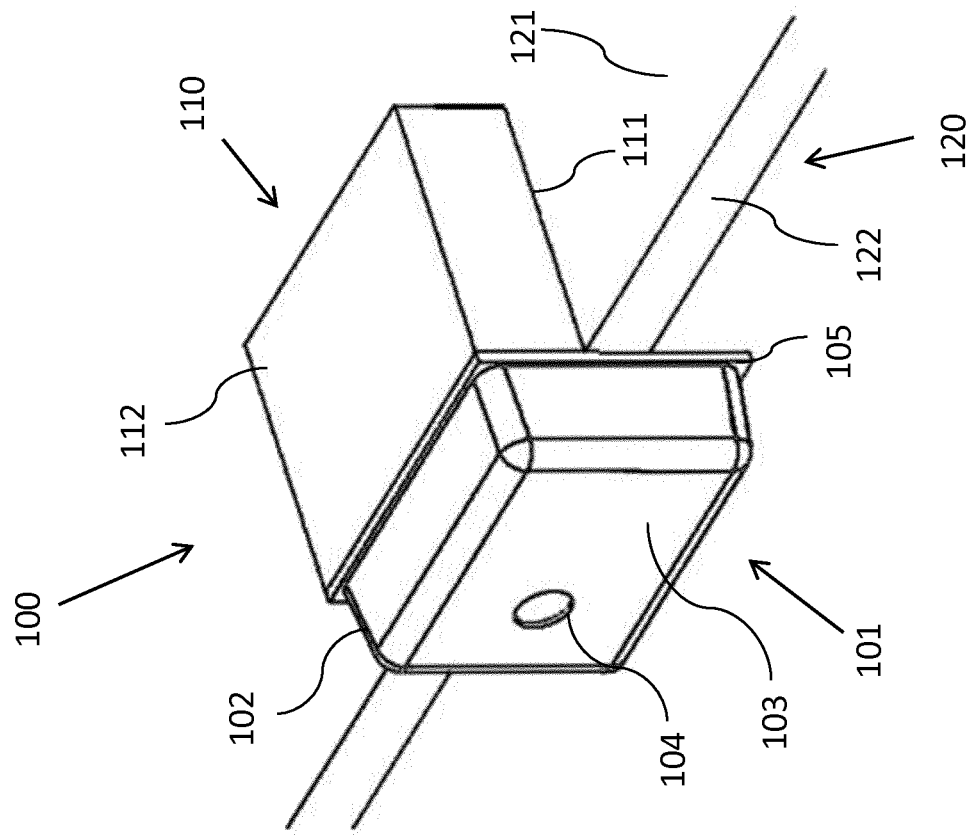
FIG. 2 shows the microphone assembly of FIG. 1 mounted on a printed circuit board according to an embodiment.

FIG. 2 shows the microphone assembly 100 of FIG. 1 mounted on a printed circuit board 120, device PCB, according to an embodiment. The device PCB 120 has an upper, substantially planar surface area or side 121 and a front edge 122, which may be at a right angle to the upper surface area 121. The microphone assembly 100 is mounted to the device PCB 120 with the mounting side 111 of the mounting element 110 resting on the surface area 121 of the device PCB, and with part of the base PCB 105 abutting the front edge 122 of the device PCB.

Figure 3:
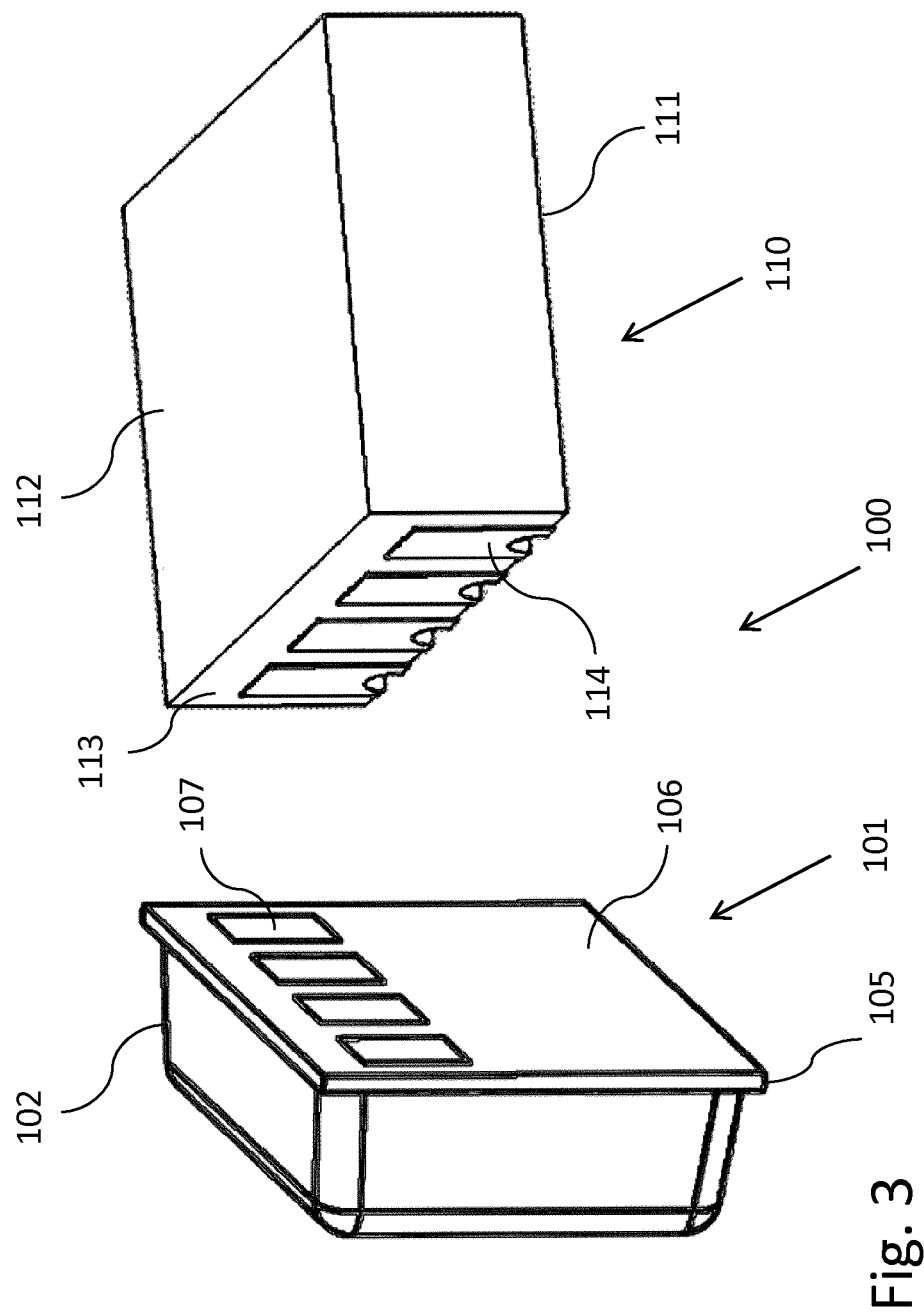
FIG. 3 shows parts of a microphone assembly according to an embodiment.

FIG. 3 shows parts of the microphone assembly 100 of FIG. 1 before being assembled according to an embodiment. The parts include the microphone unit 101 and the mounting element 110. The base PCB 105 of the microphone unit 101 has a substantially planar first contact side 106 facing away from the first side 103 of the housing 102, and the first contact side 106 holds a number of first electrical contacts or contact pads 107 for providing electrical contact between the microphone unit 101 and the mounting element 110. The mounting element 110 has a substantially planar second contact side 113, which is at a right angle to the mounting side 111, and which faces the first contact side 106 of the base PCB 105, and the second contact side 113 holds a number of second electrical contacts or contact pads 114. When the microphone unit 101 is secured to the mounting element 110, at least part of the second contact pads 114 are facing and electrically connected to corresponding first contact pads 107. When the microphone unit 101 is secured to the mounting element 110, both the first side 106 and the second contact side 113 are at a right angle to the mounting side 111. Although not shown in FIG. 3, the mounting side 111 of the mounting element 110 may be provided with a number of electrical contacts or contacts pads for mounting or soldering the mounting element 110 to the device printed circuit board. At least some of the electrical contacts or contacts pads of the mounting element 110 for soldering to the device printed circuit board are electrically connected to the electrical contacts or contact pads 114.

Figure 4:
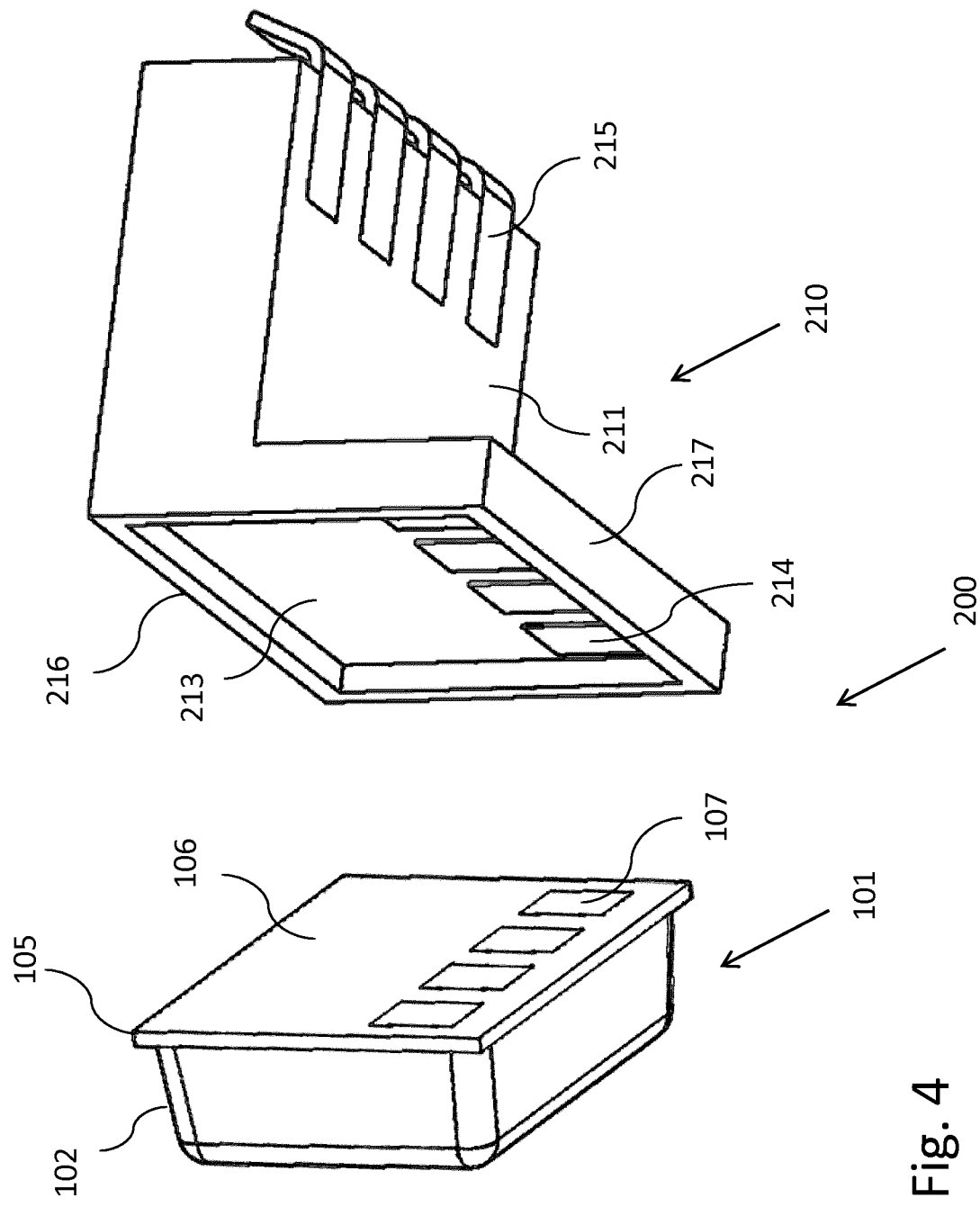
FIG. 4 shows parts of a microphone assembly according to an embodiment.

FIG. 4 shows parts of a microphone assembly 200 according to another embodiment. The parts shown in FIG. 4 include the microphone unit 101 and an alternative mounting element 210. The mounting element 210 has a substantially flat or planar mounting side 211, which holds a number of electrical contacts or contacts pads 215 for mounting or soldering the mounting element 210 to a printed circuit board. The mounting element 210 has a substantially planar second contact side 213, which may be surrounded by a mounting frame 216 formed for receiving the base PCB 105 of the microphone unit 101. The second contact side 213 holds a number of second electrical contacts or contact pads 214, and when the microphone unit 101 is secured to the alternative mounting element 210, at least part of the second contact pads 214 are electrically connected to corresponding first contact pads 107 on the first contact side 106 of the base PCB 105. When the microphone unit 101 is secured to the mounting element 210, both the first and second contact sides 106, 213 are at a right angle to the mounting side 211.

For the assembly 200 illustrated in FIG. 4, the microphone unit 101 is turned 180° when compared to the assembly 100 of FIG. 3, with the first contact pads 107 positioned in the lower part of the base PCB 105 for the assembly of FIG. 4, while the first contact pads 107 are positioned in the upper part of the base PCB 105 for the assembly 100 of FIG. 3. The mounting element 210 is substantially L-shaped, with the mounting frame 216 having a lower part 217 extending below the mounting side 211, where the lower part 217 has a rear side facing away from the first side 103 of the microphone unit 101. The mounting element 210 could also be substantially T-shaped with the mounting frame 216 arranged with an upper part extending above an upper outer surface opposite the mounting side 211 and a lower part extending below the mounting side 211. The present disclosure also covers an embodiment of an assembly rather similar to the assembly 200 illustrated in FIG. 4, where the microphone unit 101 is not turned when compared to the assembly 100 of FIG. 3, and where the contact pads 214 are arranged in an upper part or even a middle part of the contact side 213.

When using a mounting element 210 having an L-shaped or T-shaped form, the microphone unit 101 can be received by the mounting element 210 at different positions relative to the mounting side 211, whereby the audio port 104 on the first side 103 of the microphone unit can be positioned at different heights relative to the mounting side 211, and thereby also at different heights relative to a printed circuit board, when the mounting element 210 of the assembled microphone assembly is mounted to a printed circuit board.

The mounting element 210 may be secured to the printed circuit board with the rear side of the lower frame part 217 providing an abutment side for abutment with an edge of the printed circuit board.

As already mentioned before, for both mounting elements 110 and 210 of FIGS. 3 and 4, the mounting element 110, 210 may comprise electrical conduits or signal lines for connecting the second contact pads 114, 214 and thereby the contacts pads 107 of the microphone unit 101 to electrical contacts or contact pads 215 on the mounting side 111, 211.

The mounting element 110 may be an interposer printed circuit board, interposer PCB, holding contacts pads on the mounting side 111, and contact pads 114 on the second contact side 113 facing the microphone unit 101. In another possible embodiment the mounting element 110, 210 may be manufactured by molding, for example by use of plastic, and electrical contacts or contact pads 214, 215 may be provided as stamped metal lines or pads, or the mounting element may be a molded interconnect device manufactured by use of laser direct structuring (LDS) using a doped thermoplastic material with circuit traces written in the plastic by a laser, or the mounting element 110, 210 may hold one or two miniature printed circuit boards connected to the contacts pads 215 on the mounting side 111, 211 and/or to the contact pads 114, 214 on the second contact side 113, 213 facing the microphone unit 101.

When securing the microphone unit 101 to the mounting element 110 or 210, the electrical connection between the first and second electrical contacts or contact pads, 107 and 114 or 214, may be provided by use of an anisotropic conductive adhesive, ACA, such as an anisotropic conductive film, ACF, or an anisotropic conductive paste, ACP. The ACA may comprise an epoxy type resin with conductive particles. When using an anisotropic conductive adhesive for securing the microphone unit 101 to the mounting element 110 or 210, the resulting microphone assembly 100, 200 can resist reflow temperatures, whereby the microphone assembly 100, 200 can be used as a component in an engine or automatic PCB reflow process.

Figure 5:
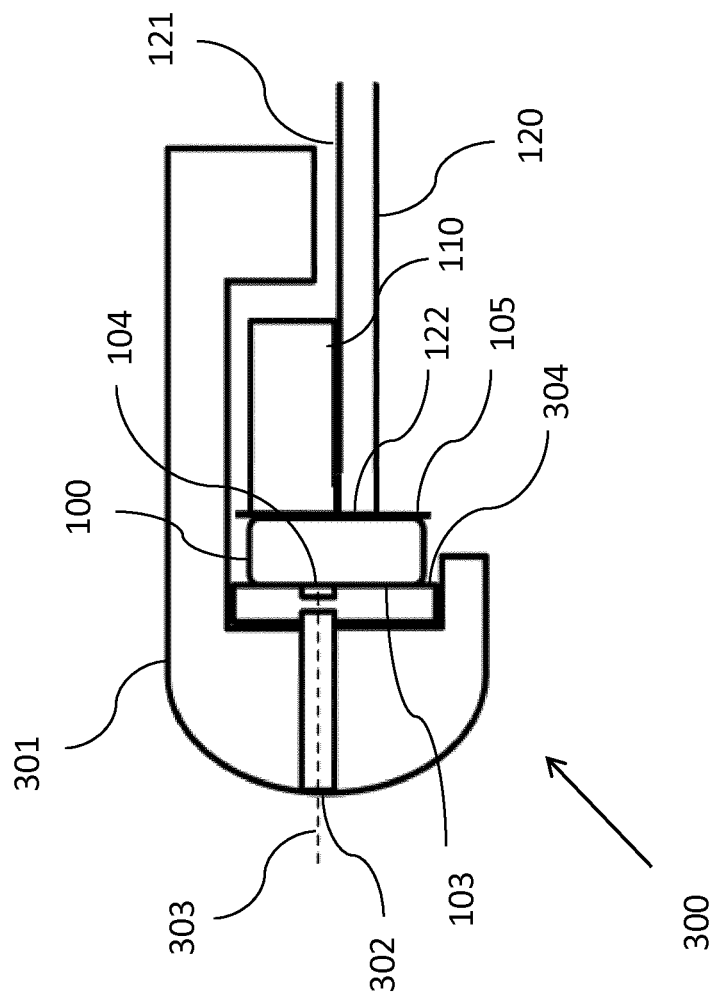
FIG. 5 shows an arrangement of a microphone assembly within an electronic device according to an embodiment.

FIG. 5 shows an arrangement of the microphone assembly 100 within an electronic device 300 according to an embodiment. The electronic device 300 comprises a device printed circuit board 120, device PCB, the microphone assembly 100, and a cover part 301. The cover part 301 has an audio channel 302 extending along a straight line 303 through a front part of the cover part 301. The microphone assembly 100 is secured to the device PCB 120 with the mounting side 111 of the mounting element 110 facing the upper surface area 121 of the device PCB 120, and the device PCB 120 is secured to the cover part 301 with the upper surface area 121 extending parallel to the center line 303 of the audio channel 302. The device PCB 120 is secured to the cover part 301 in a position, wherein the first side 103 of the microphone unit 101 faces an inner end of the audio channel 302 at a right angle to the center line 303 of the audio channel 302, and with a center line of the audio port 104 being aligned with the center line 303 of the audio channel 302. The microphone assembly 100 is secured to the device PCB 120 with the base PCB 105 of microphone unit 101 abutting the front edge 122 of the device PCB 120. The device PCB 120 is secured to the cover part 301 in a position, wherein the first side 103 of the microphone unit 101 is hold at a distance to the inner end of the audio channel 302. A dust and/or waterproof gasket or sealed closure 304 may be provided between the inner surface of the front part of the cover part 301 and the first side 103 of the microphone unit 101.

Figure 6:
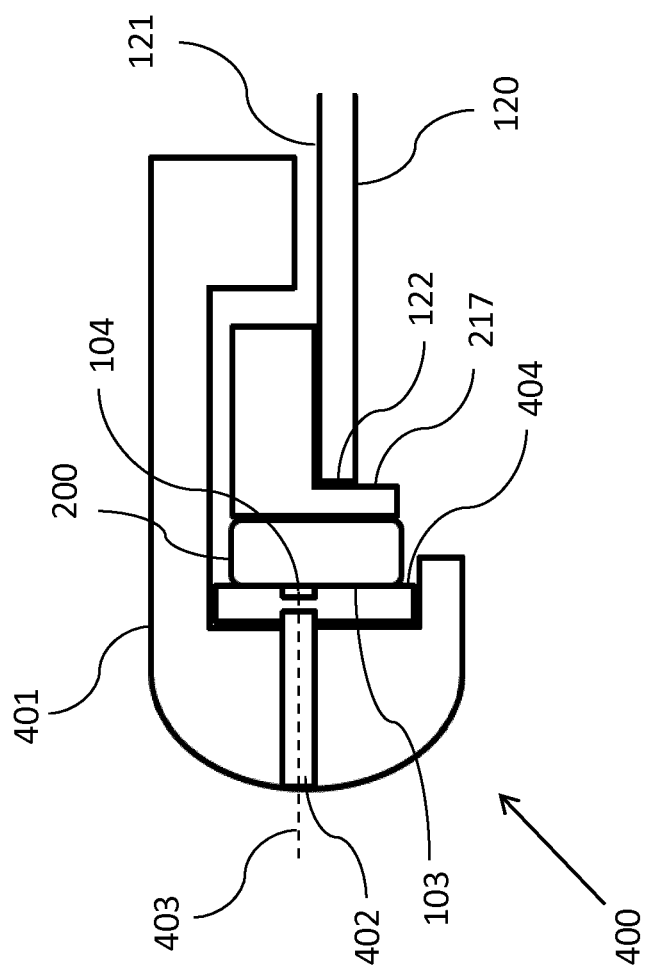
FIG. 6 shows an arrangement of a microphone assembly within an electronic device according to an embodiment.

FIG. 6 shows an arrangement of the microphone assembly 200 within an electronic device 400 according to an embodiment. The arrangement of the microphone assembly 200 within the electronic device 400 is rather similar to the arrangement of the microphone assembly 100 within the electronic device 300 of FIG. 5. Thus, the electronic device 400 comprises a device printed circuit board 120, device PCB, the microphone assembly 200, and a cover part 401, where the cover part 401 has an audio channel 402 extending along a straight line 403 through a front part of the cover part 402. The microphone assembly 200 is secured to the device PCB 120 with the mounting side 211 of the mounting element 210 facing the upper surface 121 of the device PCB 120, and the device PCB 120 is secured to the cover part 401 in a position, wherein the first side 103 of the microphone unit 101 faces an inner end of the audio channel 402 at a right angle to the center line 403 of the audio channel 402, and with a center line of the audio port 104 being aligned with the center line 403 of the audio channel 402. The device PCB 120 is secured to the cover part 401 in a position, wherein the first side 103 of the microphone unit 101 is hold at a distance to the inner end of the audio channel 420. Also for the electronic device 400, a dust and/or waterproof gasket or sealed closure 404 may be provided between the inner surface of the front part of the cover part 401 and the first side 103 of the microphone unit 101. The microphone assembly 200 differs from the microphone assembly 100 in that the mounting element 210 of assembly 200 includes a mounting frame 216 having a lower part extending below the mounting side 211 of the element 210. For the assembly 200 the base PCB 105 is received by the frame 216, and the mounting element 210 of the assembly 200 is secured to the device PCB 120 with the rear side of the lower frame part 217 abutting the front edge 122 of the device PCB 120.

It should be understood that for the electronic device 400 the position of the audio channel 402 relative to the position of device PCB 120 may vary in order to fulfill different design demands or production demands. However, the use of an L-shaped or T-shaped mounting element 210 allows the microphone unit 101 to be positioned at different positions relative to the mounting side 211 of the mounting element 210, whereby the audio port 104 of the microphone unit 101 can be positioned at different heights relative to the mounting side 211 and the device PCB 120 in order to be aligned with the audio channel 402.

Figure 7B:
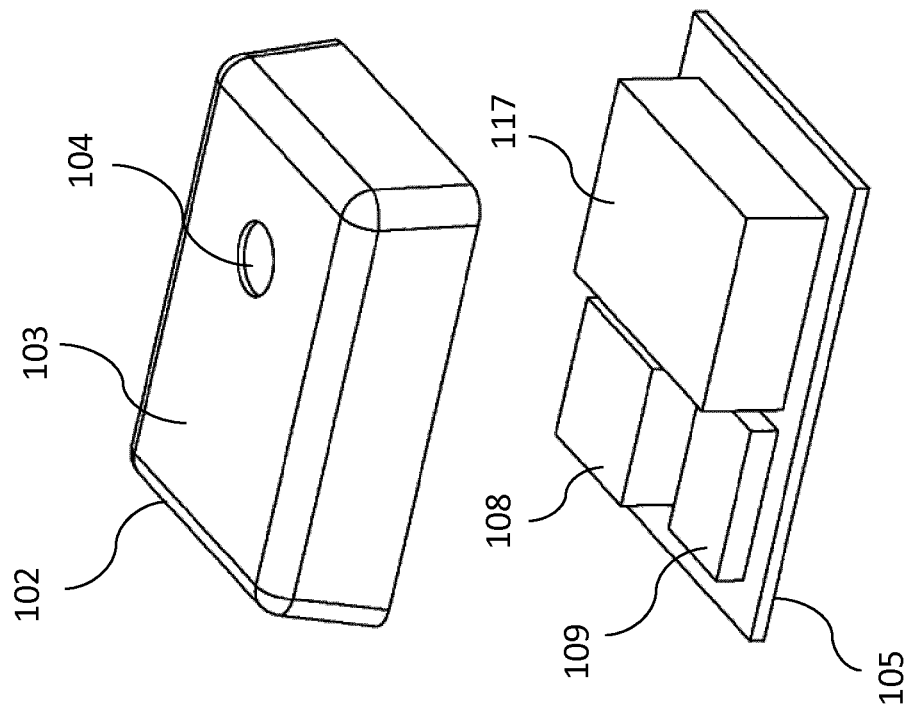
FIGS. 7a and 7b show a microphone unit in assembled and disassembled condition according to an embodiment.
Figure 7A:
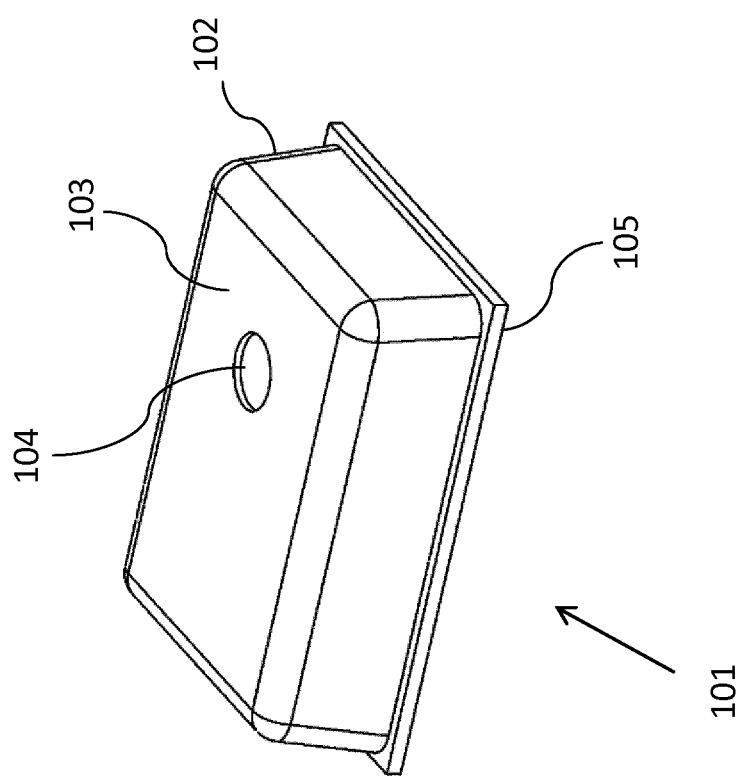

FIGS. 7a and 7b show one type of a microphone unit 101 in assembled and disassembled condition according to an embodiment. The microphone unit 101 is used in the microphone assemblies 100 and 200. The microphone unit 101 has a housing or lid 102, which may be a metal housing 102, with an outwards facing first side 103, where an aperture or an audio port 104 is provided in the first side 103, and the housing 102 is secured to a base printed circuit board 105, base PCB.

The microphone unit 101 may comprise a microphone component, i.e. a transducer that converts sound into an electrical signal, e.g. in the form of a microelectromechanical systems (MEMS) microphone package holding a MEMS microphone die 117 attached to the base PCB 105, within a chamber formed by the lid or housing 102 and the base PCB 105. Sound enters the chamber through the audio port 104, and the microphone die 117 detects the sound and generates corresponding electrical signals. Other dies 108, 109 may be co-located with the microphone die 117 on the base PCB 105 within the chamber, in order to process the electrical signals generated by the microphone die 117. The microphone unit 101 may also include electrical contact pads 107 on the bottom surface of the base PCB 105, for mechanically and electrically connecting of the microphone unit 101 to the mounting element 110 or 210. The components or dies 117, 108, 109 may be fixed to the base PCB 105 by chip glue, which may polymerize during curing, and the metal housing 102 may be secured to the base PCB by soldering using a high temperature solder paste, whereby the microphone unit 101 can resist reflow temperatures used as a component in an engine or automatic PCB reflow process. It should be understood that the present disclosure also covers microphone assemblies 100, 200 for which other types of microphones than the illustrated MEMS microphone are used.

Various aspects and implementations of the present disclosure have been described in conjunction with various embodiments herein. However, other variations to the disclosed embodiments can be understood and effected by those skilled in the art in practicing the claimed subject-matter, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The reference signs used in the claims shall not be construed as limiting the scope.

The invention claimed is:

1. A microphone assembly comprising a microphone unit including a housing that encloses a microphone component, said housing secured to a mounting element the housing of said microphone unit being provided with a first side comprising an audio port, the housing of said microphone unit including a second side, said mounting element comprising a rigid body having a mounting side and said second side of the housing of the microphone unit being arranged at a right angle to said mounting side, the mounting element including a housing side arranged at a right angle to the mounting side, said second side of said housing mounted to the housing side of the mounting element.

2. A microphone assembly according to claim 1, wherein said mounting side is configured for being mounted or soldered to a printed circuit board.

3. A microphone assembly according to claim 2, wherein said microphone unit comprises a base printed circuit board, wherein said housing is secured to said base printed circuit board with the audio port facing away from said base printed circuit board, and wherein the base printed circuit board is secured to said housing side of the mounting element.

4. A microphone assembly according to claim 3, wherein said base printed circuit board has a planar first contact side facing away from said first side, said first contact side being provided with a number of first electrical contacts for providing electrical contact between the microphone unit and the mounting element.

5. A microphone assembly according to claim 4, wherein said mounting element has a planar second contact side facing said first contact side of the base printed circuit board, said second contact side being provided with a number of second electrical contacts.

6. A microphone assembly according to claim 1, wherein said mounting element comprises electrical conduits for connecting said microphone unit to electrical contacts in said mounting side.

7. A microphone assembly according to claim 1, wherein said mounting element comprises a miniature printed circuit board, an insert molded plastic or a sheet metal part.

8. A microphone assembly according to claim 1, wherein said mounting element comprises an abutment side parallel with said first side and facing away from said first side.

9. A microphone assembly according to claim 1, wherein said assembly forms an L-shaped part.

10. A microphone assembly according to claim 1, wherein said assembly forms a T-shaped part.

11. A microphone assembly according to claim 1, wherein said mounting side is planar.

12. An electronic device comprising a device printed circuit board and a microphone assembly according to claim 1, wherein said mounting surface of the mounting element of the microphone assembly is mounted to said device printed circuit board.

13. An electronic device according to claim 12, further comprising a cover part provided with an audio channel extending along a straight line through said cover part towards said audio port.

14. An electronic device according to claim 13, wherein said audio port is aligned with said straight audio channel.

15. A microphone assembly adapted to be securely attached and in electrical connection to a device printed circuit board having a side and an edge, the microphone assembly comprising a microphone unit and a mounting element, the microphone unit including a microphone, the microphone unit further including a microphone housing comprising a first side and a second side, the first side provided with an audio port in communication with the microphone, the second side adapted to be rigidly secured to and in electrical contact with the mounting element, the mounting element comprising a rigid body adapted to be secured in electrical contact to the microphone unit and in electrical contact to the printed circuit board, the mounting element having at least one mounting side for mounting to the printed circuit board, wherein the microphone assembly is secured to the side and the edge of the printed circuit board adapted to secure the microphone unit in a fixed position.

16. A microphone assembly according to claim 15, wherein the edge of the device printed circuit board is planar, the side of the device printed circuit board is planar, and the planar edge of the device printed circuit board is perpendicular to the planar side of said printed circuit board.

17. A microphone assembly according to claim 16, wherein the microphone assembly is secured to the device printed circuit board so that the audio port of the microphone unit housing is in audio communication with an audio channel of a housing of an electronic device in which the device printed circuit board is housed.

18. An electronic device comprising a cover part provided with an audio channel, the electronic device including a microphone assembly adapted to be securely attached and in electrical connection to a device printed circuit board having a side and an edge, the microphone assembly comprising a microphone unit and a mounting element, the microphone unit including a microphone, the microphone unit further including a microphone housing comprising a first side and a second side, the first side provided with an audio port in communication with the microphone, the second side adapted to be rigidly secured to and in electrical contact with the mounting element, the mounting element comprising a rigid body adapted to be secured in electrical contact to the microphone unit and in electrical contact to the printed circuit board, the mounting element having at least one mounting side for mounting to the printed circuit board, wherein the microphone assembly is secured to the side and the edge of the printed circuit board adapted to secure the microphone unit in a fixed position in which the audio port is in audio communication with the audio channel of the cover part of the electronic device, the cover part being disposed at least partially around the microphone unit and the mounting element.

19. The electronic device according to claim 18, wherein said audio port is aligned with said straight audio channel.

20. The electronic device according to claim 19, wherein the base printed circuit board has a planar first contact side facing away from said first side of the housing of the microphone unit, said first contact side being provided with a number of first electrical contacts for providing electrical contact between the microphone unit and the mounting element and wherein the edge of the device printed circuit board is planar, the side of the device printed circuit board is planar, and the planar edge of the device printed circuit board is perpendicular to the planar side of said printed circuit board.

\* \* \* \* \*